(12) United States Patent
Chua et al.

(10) Patent No.: US 7,120,182 B2
(45) Date of Patent: Oct. 10, 2006

(54) DENSELY-PACKED LIGHT EMITTERS WITH LAYERED SEMICONDUCTOR STRUCTURE AND METHODS OF MAKING THE LIGHT EMITTERS

(75) Inventors: Christopher L. Chua, San Jose, CA (US); Decai Sun, Los Altos, CA (US)

(73) Assignee: Palo Alto Research Center, Inc., Palo Alto, CA (US)

( * ) Notice: Subject to any disclaimer, the term of this patent is extended or adjusted under 35 U.S.C. 154(b) by 230 days.

(21) Appl. No.: 10/739,181

(22) Filed: Dec. 19, 2003

(65) Prior Publication Data
US 2005/0135448 A1   Jun. 23, 2005

(51) Int. Cl.
*H01S 5/20* (2006.01)
*H01S 5/00* (2006.01)

(52) U.S. Cl. .............................. 372/46.013; 372/45.01

(58) Field of Classification Search ............ 372/46.013, 372/50.12, 43, 45.01
See application file for complete search history.

(56) References Cited

U.S. PATENT DOCUMENTS

| 5,034,956 A | * | 7/1991 | Gessner et al. ........... 372/45.01 |
| 6,052,399 A | | 4/2000 | Sun |
| 6,580,741 B1 | * | 6/2003 | Jiang et al. ............... 372/50.11 |
| 6,744,800 B1 | * | 6/2004 | Kneissl et al. ............. 372/50.1 |

* cited by examiner

*Primary Examiner*—Armando Rodriguez
(74) *Attorney, Agent, or Firm*—Oliff & Berridge, PLC

(57) ABSTRACT

An array of light emitters includes a plurality of light emitting structures formed over a layered structure with at least one quantum well layer. At least one cladding layer is formed on over the at least one quantum well layer. At least one waveguide layer is formed on or over the at least one cladding layer. At least one isolation region is formed at least in between at least two of the plurality of light emitting structures. The at least one isolation region isolates the at least two light emitting structures from each other.

22 Claims, 8 Drawing Sheets

DENSELY-PACKED LIGHT EMITTERS WITH LAYERED SEMICONDUCTOR STRUCTURE AND METHODS OF MAKING THE LIGHT EMITTERS

BACKGROUND OF THE INVENTION

1. Field of Invention

The invention is directed to light emitters having layered semiconductor structures.

2. Description of Related Art

Light emitters with layered semiconductor structures, such as solid-state semiconductor lasers, are used as light sources for high-speed laser printing, optical fiber communications, data storage and other applications. One exemplary semiconductor laser is a so-called "edge emitting laser", where light is emitted from the edge of the layered semiconductor structure. The light from the light emitters is usually emitted from specific defined regions, called ridge waveguides, of the structure. Such ridge waveguides form the lateral optical confinement structure and are typically small ridges of semiconductor material, with a generally flat upper surface and sloped sidewalls, that are created on top of the active semiconductor layer that emits light. A quantum well lies below the ridge waveguides. Light is generated in the quantum well by combining holes and electrons when the light emitter is driven. The quantum well is surrounded by cladding layers.

The semiconductor layers forming the light emitter are often formed using group III-V semiconductors. Many different group III-V semiconductor layers are stacked in turn to form the light emitter. Some of these layers are either p or n doped. Other ones of these layers are intrinsic, i.e., undoped. Many of the layers are multiple compound semiconductors that contain multiple group III cations and multiple group V anions. For example, group III cations include aluminum and gallium, while group V anions include arsenic and phosphorus. In many light emitters, the cladding layers and the waveguide layers includes phosphorous as part of the group V element. An example is disclosed in U.S. Pat. No. 6,502,399, which is incorporated herein by reference in its entirety.

When used in applications such as printing, optical fiber communications, data storage or the like, such phosphorous-containing semiconductor light emitters are often arranged in an array of multiple emitters. A multiple light emitter array shares a common bottom, or n-electrode and has separate, independently addressable, upper or p-electrodes.

SUMMARY OF THE INVENTION

Dual-spot arrays with two emitters in a single semiconductor emitter already play a prominent role in many devices. Semiconductor light emitters with more than two emitters will improve device performance. However, current semiconductor light emitters that use phosphorus have problems. Further, packing more lasers into a single semiconductor light emitter can result in light emitters that are not electrically and/or optically isolated from each other. In highly packed semiconductor light emitters, degradation in droop and cross-talk is observed.

This invention provides devices having a plurality of light emitters with isolation regions at least between the plurality of light emitters.

This invention separately provides devices having a desired number of quantum wells that emit a desired wavelength of light.

This invention separately provides devices having a layered semiconductor structure having layers that do not contain phosphorous.

This invention separately provides methods for forming a plurality of light emitters with isolation regions at least between the plurality of light emitters.

This invention separately provides methods for forming a desired number of quantum wells that emit a desired wavelength of light.

This invention separately provides methods for forming a layered semiconductor structure formed of layers that do not contain phosphorous.

In various exemplary embodiments, systems, devices and methods provided by this invention include an apparatus with isolation regions that provide physical barriers between the plurality of light emitters. In various exemplary embodiments, such barriers are formed by removing material between the light emitters. In various other exemplary embodiments, such barriers are formed by passivating a region between the light emitters. In various exemplary embodiments, both types of barriers are formed in the apparatus. In such exemplary embodiments, an apparatus has isolation regions that are partially formed by removal of material and/or partially formed by passivation of a region. In general, an apparatus according to this invention can use various combinations of isolation regions.

In various exemplary embodiments, systems, devices and methods provided by this invention separately provide an apparatus with isolation regions having desired number of quantum wells that emit a desired wavelength of light. In various other exemplary embodiments, systems, devices and methods provided by this invention separately provide an apparatus with isolation regions having desired number of quantum wells formed of a layered semiconductor structure having layers that do not contain phosphorous.

In various exemplary embodiments, systems, devices and methods according to this invention provide methods for forming a semiconductor structure with isolations regions, i.e., physical barriers between light emitters. In various exemplary embodiments, such barriers are formed by removing material between the light emitters of the semiconductor structure. In other various exemplary embodiments, such barriers are formed by passivating a region between the light emitters of the semiconductor structure. In some exemplary embodiments, both types of isolation regions are formed in the semiconductor structure. In various exemplary embodiments, the isolation regions are formed by partially removing material and partially passivating regions between the light emitters.

In various exemplary embodiments of the methods according to this invention, desired numbers of quantum wells that emit a desired wavelength of light are formed in light emitters with isolation regions. In various other exemplary embodiments of the method, light emitters are formed having desired number of quantum wells with a layered semiconductor structure that do not contain phosphorous.

These and other features and advantages of this invention are described in, or apparent from, the following detailed description of various exemplary embodiments of the apparatus and method according to this invention.

BRIEF DESCRIPTION OF THE DRAWINGS

Various exemplary embodiments of this invention will be described in detail, with reference to the following figures, wherein.

DETAILED DESCRIPTION OF EXEMPLARY EMBODIMENTS

Figure 1:
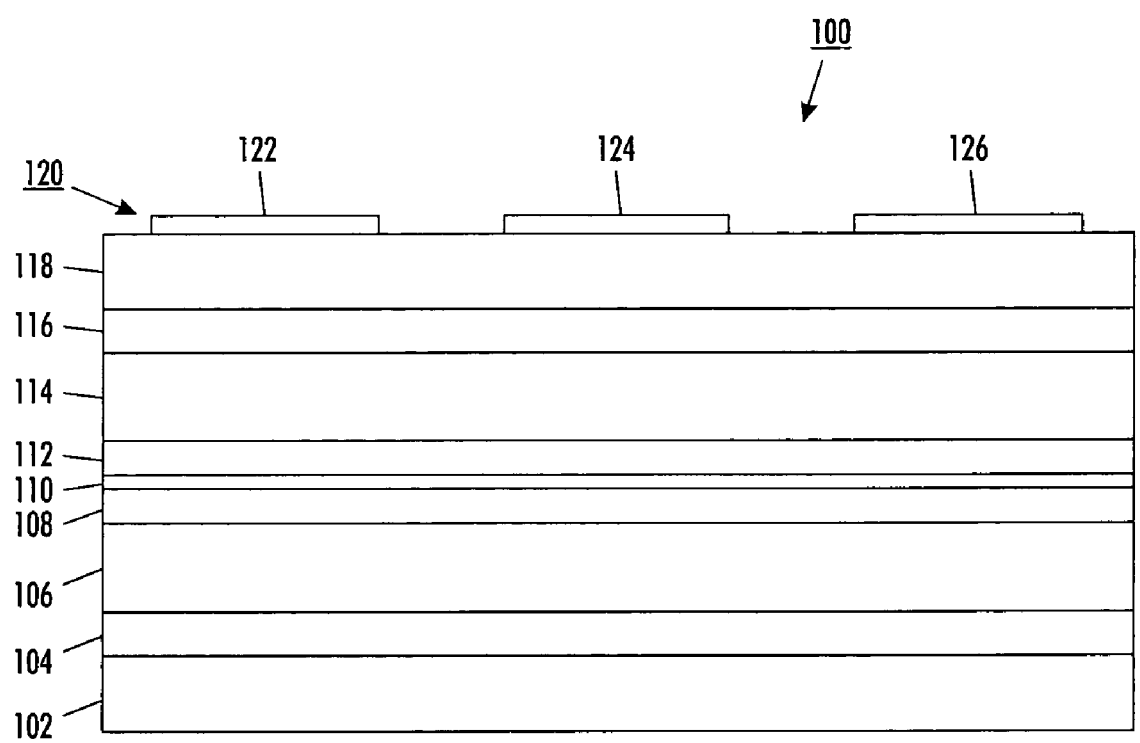
FIG. 1 shows one exemplary embodiment of a layered semiconductor structure usable with the light emitter according to this invention.

FIG. 1 shows one exemplary embodiment of the general structure of a layered semiconductor structure 100 usable to implement the multi-spot emitter devices according to this invention. The layered semiconductor structure 100 includes a group III-V semiconductor substrate 102; a complex group III-V semiconductor layer 104 formed on or over the substrate 102; a waveguide layer 106 formed on or over the complex semiconductor layer 104; a first cladding layer 108 formed on or over the waveguide layer 106; a quantum well layer 110 formed on or over the first cladding layer 108; a second cladding layer 112 formed on or over the quantum well layer 110; a second waveguide layer 114 formed on or over the second cladding layer 112; an intrinsic group III-V layer 116 formed on or over the second waveguide layer 114; a doped group III-V layer 118 on or over the intrinsic group III-V layer 116; and portions 122, 124 and 126 of a patterned silicon nitride layer 120 formed on or over the doped group III-V layer 118.

The group III-V semiconductor substrate layer 102 can be a gallium arsenide (GaAs) substrate and may be doped or may be intrinsic. If doped, the substrate layer 102 can be n-doped. The layer 102 may have any desired thickness.

The complex group III-V semiconductor layer 104 includes two types of cations. In various exemplary embodiment, these two types of cations can be aluminum and gallium. Thus, the semiconductor layer 104 may be aluminum gallium arsenide (AlGaAs). The aluminum gallium arsenide layer 104 may also be doped or intrinsic. The complex group III-V semiconductor layer 104 may also have any desired thickness. One exemplary thickness for the complex group III-V semiconductor layer 104 is 225 nm.

The first waveguide layer 106 may contain the same elements as the complex group III-V semiconductor layer 104. However, the constituent group III elements may differ in concentration between the complex group III-V semiconductor layer 104 and the first waveguide layer 106. In one exemplary embodiment, both the complex group III-V semiconductor layer 104 and the waveguide layer 106 are aluminum gallium arsenide (AlGaAs). However, the ratio of aluminum to gallium may differ between the complex group III-V semiconductor layer 104 and the waveguide layer 106. For example, the complex group III-V semiconductor layer 104 may be $Al_{0.2}Ga_{0.8}As$, while the first waveguide layer 106 may be $Al_{0.75}Ga_{0.25}As$. The first waveguide layer 106 may be doped. The exemplary doping is n-doping. The first waveguide layer 106 may have a thickness of, for example, 1097 nm (1.1 µm).

The interior of the layered semiconductor structure 100 contains a light emitting structure that includes a quantum well layer 110 interposed between the first and second cladding layers 108 and 112. In this exemplary layered semiconductor structure 100, the first cladding layer 108 may be a layer of aluminum gallium arsenide. One exemplary ratio for the group III cations for the layer 108 may be $Al_{0.4}Ga_{0.6}As$. The first cladding layer 108 may be doped or undoped, and may be an intrinsic semiconductor layer. In various exemplary embodiments, the first cladding layer 108 intrinsic layer.

In the exemplary layered semiconductor structure 100 shown in FIG. 1, the quantum well layer 110 is shown as an indium aluminum gallium arsenide (InAlGaAs) layer. The layered semiconductor structure 100 shown in FIG. 1 is a single quantum well device. However, it should be appreciated that multiple quantum wells may be formed by creating multiple interposed sets of InAlGaAs layers. Moreover, the wavelength of light emitted from the layered semiconductor structure 100 may be changed as desired by varying the ratio of indium, aluminum, gallium, and/or arsenic, or the like. For example, the layered semiconductor structure 100 shown in FIG. 1 emits light at a wavelength of between 700 and 850 nm, such as, for example, 780 nm, and may be a layer 5 nm thick.

The second cladding layer 112, which is formed over the quantum well layer 110, can also be formed of aluminum gallium arsenide. In various exemplary embodiments of the layered semiconductor structure 100, the first cladding layer 108 and the second cladding layer 112 may have similar composition and dimensions. That is, in various exemplary embodiments, the second cladding layer 112 corresponds to the first cladding layer 108. Specifically, the second cladding layer 112 may be formed identically to the first cladding layer 108. If so, the second cladding layer 112 is also a aluminum gallium arsenide layer with proportions of $Al_{0.4}Ga_{0.6}As$. The second cladding layer 112 may be 139 nm thick and may be either doped or intrinsic. In the exemplary layered semiconductor structure 100 shown in FIG. 1, the second cladding layer 112 is intrinsic. However, the first cladding layer 108 and the second cladding layer 112 need not be similar.

The second waveguide layer 114 may be aluminum gallium arsenide with a composition of $Al_{0.75}Ga_{0.25}As$. In various exemplary embodiments, the second waveguide layer 114 corresponds to the first waveguide layer 106. The second waveguide layer 114 may be 1097 nm (1.1 µm) thick. In various exemplary embodiments, the second waveguide layer 114 may be doped. In the exemplary layered semiconductor structure 100, shown in the second waveguide layer may be p-doped.

The aluminum gallium arsenide layer formed on over the second waveguide layer 114, may be intrinsic, and may have group III cations at a concentration of; for example, $Al_{0.4}Ga_{0.6}$. The intrinsic group III-V layer 116 may be 56 nm thick. Finally, the doped group III-V layer 118 may be n-doped. The thickness of the doped group III-V layer 57 nm.

The silicon nitride layer 120 functions as a mask for the oxidation step in subsequent processing. If desired, other suitable mask layers, such as silicon oxide or spin-on glass can be used instead of the silicon nitride layer 120. The silicon nitride layer 120 is patterned to form the portions 122, 124 and 126.

Figure 2:
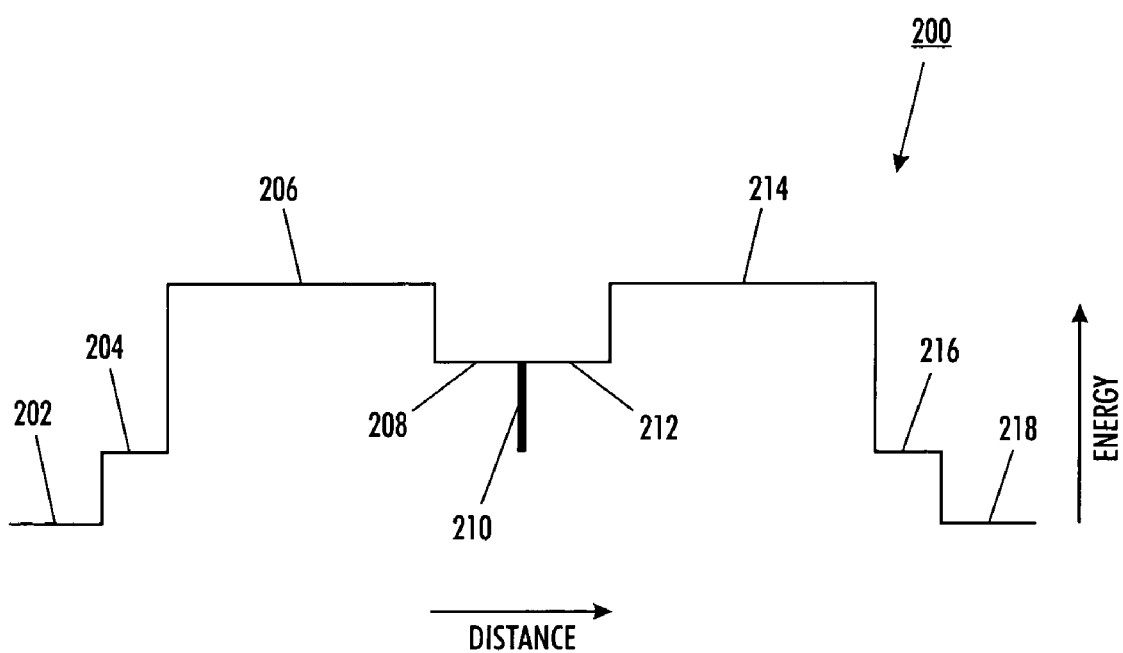
FIG. 2 schematically illustrates the conduction band gap of the layered semiconductor structure shown in FIG. 1.

FIG. 2 schematically illustrates the conduction band gap of the layered semiconductor structure 100 shown in FIG. 1. The band diagram specifically shows the conduction band energy levels. There is a corresponding valence band energy levels that is a mirror image of the conduction band energy shown in FIG. 2, which is not shown.

The band diagram schematically shown in FIG. 2 illustrates the thickness of each layer in distance from left to right and the energy from bottom to top. The thickness and the energy levels are meant to show a qualitative value rather than a quantitative measure of the exact thickness or energy. Nevertheless, the reference numbers in FIG. 2 has corresponding reference numbers of the layers in the general structure 100 of FIG. 1.

Shown in FIG. 2, from left to right, are a conduction band energy levels of the group III-V semiconductor substrate 202; a complex group III-V semiconductor level 204; the waveguide level 206; the first cladding level 208; the quantum well level 210; the second cladding level 212; the second waveguide level 214; the intrinsic group III-V level 216; and the doped group III-V level 218.

As shown in FIG. 2, the energy levels of the first and second waveguide levels 206 and 214 energetically confine the first and second cladding levels 208 and 212 as well as the quantum well level 210. Because the quantum well represents a local low energy level, electrons near the quantum well will be confined within the quantum well level 210 to be more efficiently recombined with its corresponding hole to emit light. FIG. 2 shows the conduction band energy level of the quantum well as a layer of indium aluminum gallium arsenide single quantum well emitting a light of having a wavelength of between 700 and 850 nm, preferably 780 nm. The addition of indium allows the quantum well level to have an energy level lower than that of the cladding levels. The exact wavelength of light emitted from the quantum well may be controlled by the addition of a specific amount of indium to the aluminum gallium arsenide layer to create the quantum well. Other doping may be used as desired to create a precise wavelength light output from the quantum well. For example, addition of nitrogen allows longer wavelength light to be output from the quantum well.

Further, the quantum well may be a single quantum well as shown in FIG. 2, or may be multiple quantum wells as desired. Suitable changes to the cladding layer and/or the waveguide layer may be made in order to create multiple quantum wells. If desired, multiple quantum wells may each emit different wavelength light.

Figure 3:
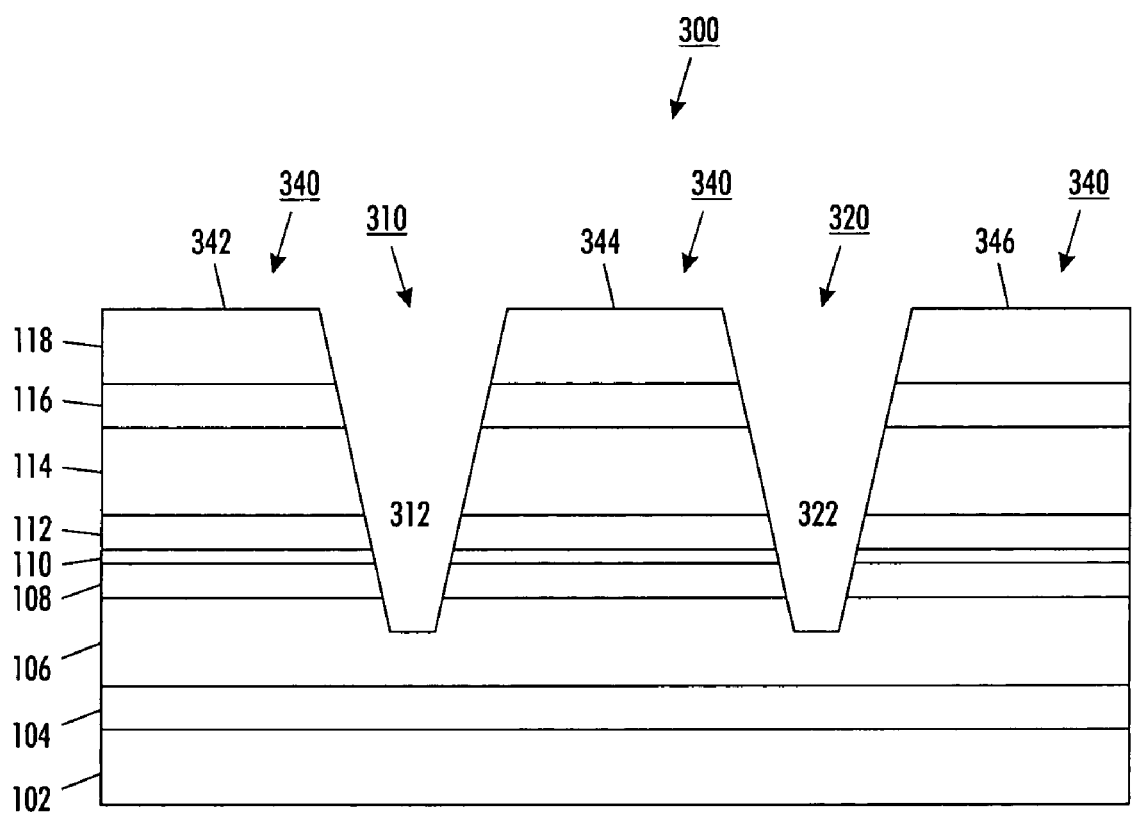
FIG. 3 shows a first exemplary embodiment of the light emitter according to this invention.

FIG. 3 shows an exemplary embodiment of a light emitter device 300 that includes one exemplary embodiment of a number of isolation regions 310 and 320.

As shown in FIG. 3, the isolation regions 310 and 320 allow the light emitter 300 to have reduced crosstalk between adjacent light emitters 340. In the exemplary embodiment shown in FIG. 3, the isolation regions 310 and 320 are formed by etching trenches 312 and 322 into the layered semiconductor structure 100 shown in FIG. 1 past the quantum well active layer 110 and into at least the first cladding layer 106. The trenches 312 and 322 may even pass through the first cladding layer 106 and extend into the aluminum gallium arsenide layer 104. When the trenches 312 and 322 extend into the aluminum gallium arsenide layer 104, the substrate layer 102 may be thickened so that the mechanical strength of the light emitter device 300 is not reduced, or sacrificed.

Each of the trenches 312 and 322 allow each light emitter regions 342, 344 and 346 of the light emitters 340 to be electrically and/or optically isolated from each other. The formed trench areas 312 and 322 of the isolation regions 310 and 320 may be left empty or may be filled with an electrically, optically and/or thermally insulating material. The trenches 312 and 322 may have a sloped shape, as shown in FIG. 3, or may have parallel sidewalls of the trenches 312 and 322. The walls, if sloped, can have any appropriate angle. Although any appropriate etching technique may be used, one exemplary etching technique is a dry etching technique, such as chlorine-based, chemically-assisted ion beam etching (Cl-based CAIBE). However, other etching techniques, such as reactive ion etching (RIE) or the like may be used.

Figure 4:
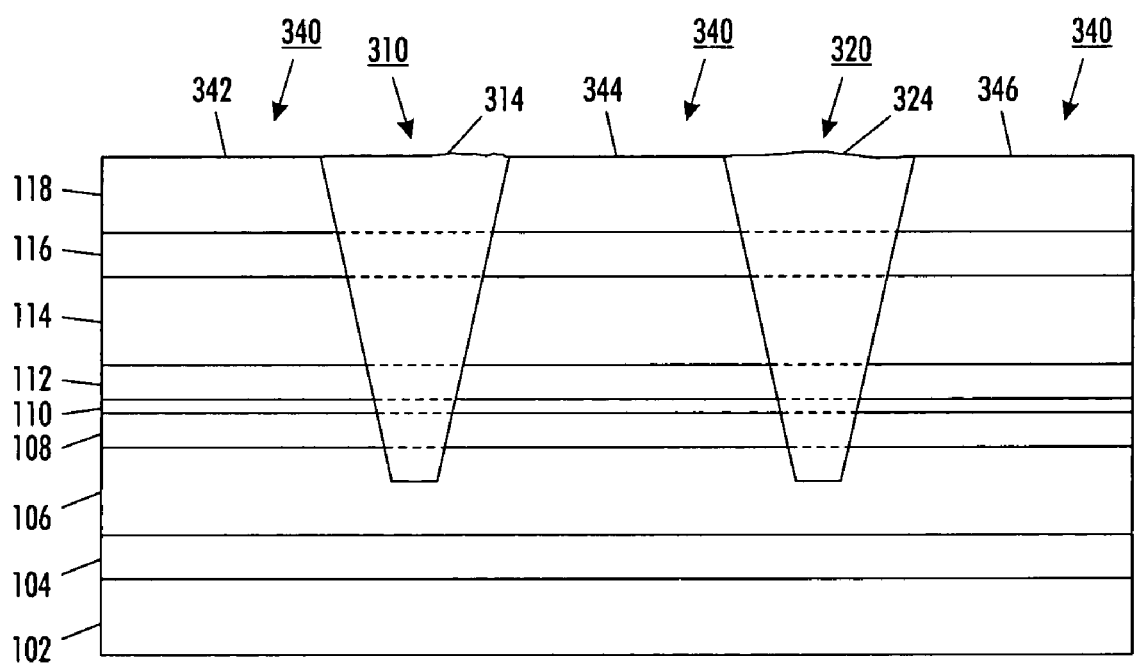
FIG. 4 shows a second exemplary embodiment of the light emitter according to this invention.

As shown in FIG. 4, as an alternative to etching the isolation trenches 312 and 322, which are regions formed by physically removing material from the layered structure 100, ion implantation may be employed to create the isolation regions 310 and 320, by rendering the implant areas 314 and 324 non-conductive. In this case, material is not removed from the layered structure 100. Rather, the electronic layers are only passivated, which maintains the mechanical integrity of the layered structure 100.

In the exemplary embodiment shown in FIG. 4, the isolation regions 310 and 320 are formed by creating non-conductive areas 314 and 324 in the layered structure between the light emitter 340. In various exemplary embodiments, the non-conductive regions 314 and 324 are formed by ion implantation. A typical ion implantation process uses 100 KeV protons at a dosage of $3 \times 10^{15}$ protons with the surface of the layered structure masked by a 7 μm thick photoresist. Such ion implantation may be performed before the ridge waveguides are etched. The ion implantation can also be done after any electrical contacts are formed. It should be appreciated that the exact implantation energy and dosage depend on the amount and type of materials the ions must penetrate and may be adjusted appropriately.

As an alternative to passivating the areas 314 and 324 to form the isolation regions 310 and 320, the isolation regions 310 and 320 shown in FIG. 4 may be formed by refilling the etched trenches 312 and 322 discussed above with respect to FIG. 3 with insulating material to form the non-conductive areas 314 and 324. For instance, the fill material may be undoped GaAs, a polymer such as polyimide, or a dielectric such as silicon nitride. Refilling the trenches 312 and 322 not only acts to isolate the light emitters 340, but also tends to improve device integrity of the layered structure 100.

Figure 5:
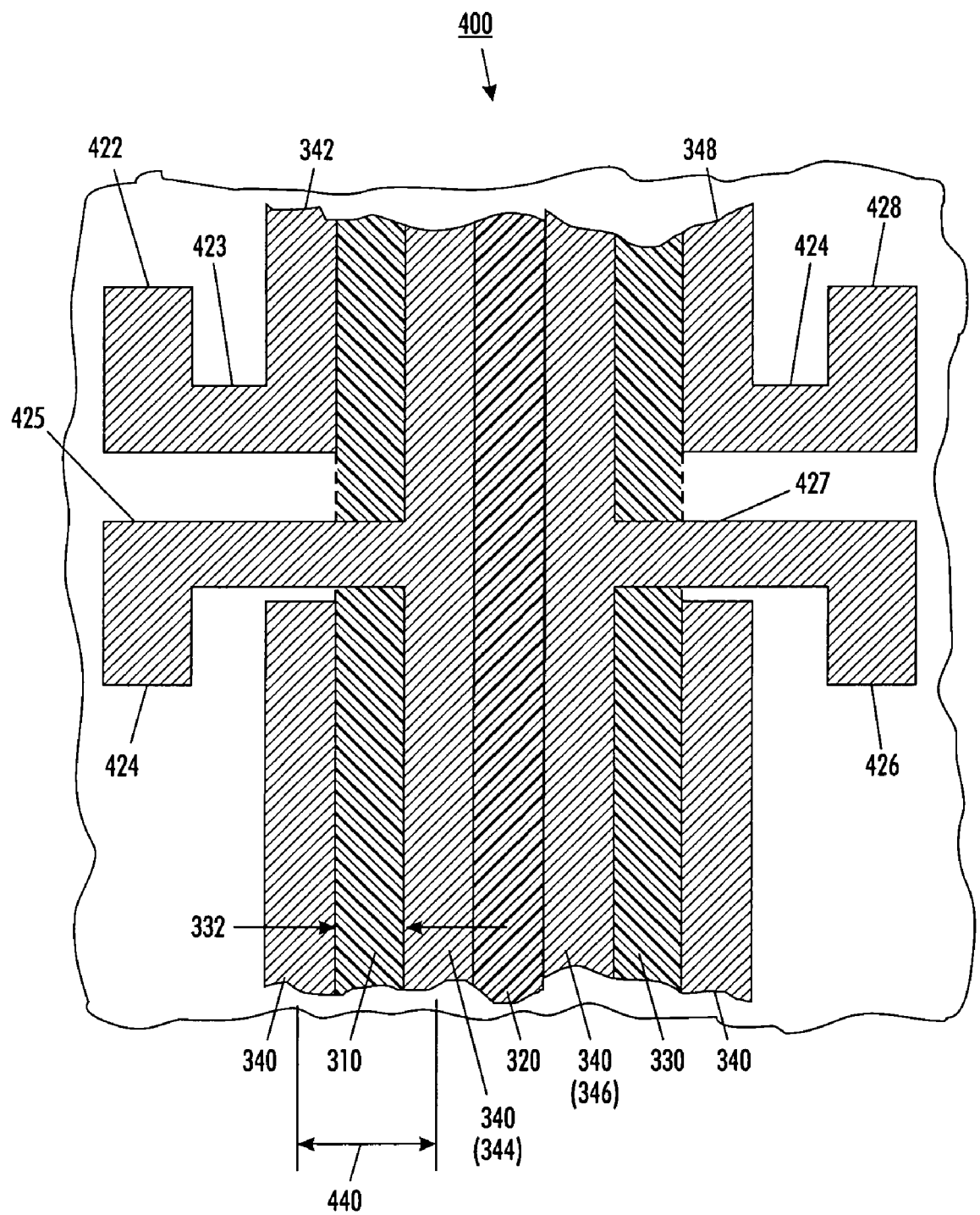
FIG. 5 illustrates a third embodiment of the light emitter according to this invention.

FIG. 5 shows a top view of one exemplary embodiment of a multi-array light emitting structure 400 according to this invention, that can be implemented using either of the two exemplary embodiments of the light emitter devices 300 shown in FIGS. 3 and 4. As shown in FIG. 5, the multi-array light emitting structure 400 includes a number of laser elements 340, spaced at a desired pitch 440 by a number of isolation regions 310–330.

The light emitter device 400 shown in FIG. 5 includes four light emitters 340, individually designated as light emitters 342, 344, 346 and 348. Such a four-emitter array is called a quad-spot laser. Other light emitting array structures are possible, such as a dual spot (a two-emitter array) laser, a tri-spot (a three-emitter array) laser, a hex-spot (a six-emitter array) laser, and an octa-spot (an eight-emitter array) laser. In the exemplary quad-spot laser light emitting device 400, the contact pads 422, 424, 426, and 428, allow each of the corresponding light emitters 342, 344, 346 and 348 separately addressed. The isolation regions 310, 320, 330 maybe ion implanted, trenched, and/or filled to achieve better device isolation and lower electrical crosstalk between the light emitters 340. In larger light emitting arrays, such as hex-spot lasers or octa-spot lasers, the layouts contain additional contact pads and isolation regions and similar sections to accommodate extra electrical routing paths for the inner ridge waveguides. The contact pads 422–428 have corresponding connecting electrical paths 423, 425, 427 and 429, respectively. In various exemplary embodiments, a width 332 of the isolating regions 310–330 is 3 μm, and the pitch 440 between the emitters 340 is 7 μm. Because of pitch between the emitters 340 can be as small as 7 μm, denser packing of the light emitters 340 is allowed without sacrificing droop or crosstalk.

Figure 6:
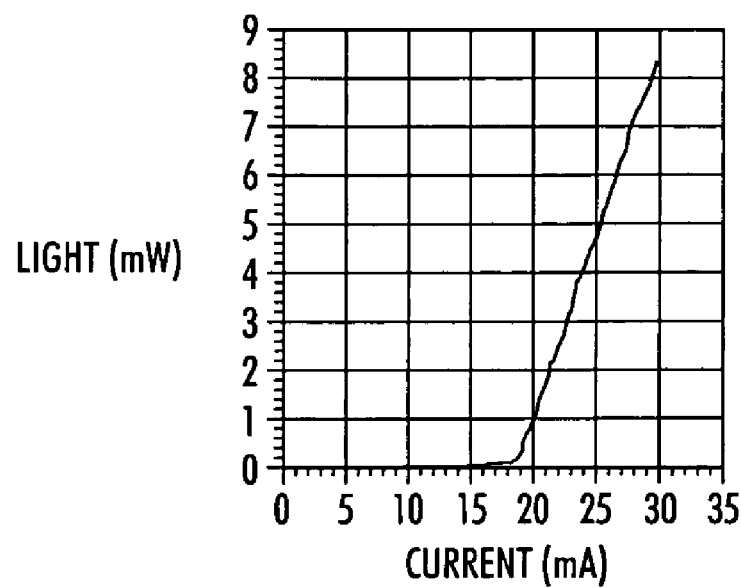
FIGS. 6–9 show the light versus current characteristics of the four light emitting elements of an exemplary phosphorous free quad-spot laser array that employs the isolation regions.
Figure 7:
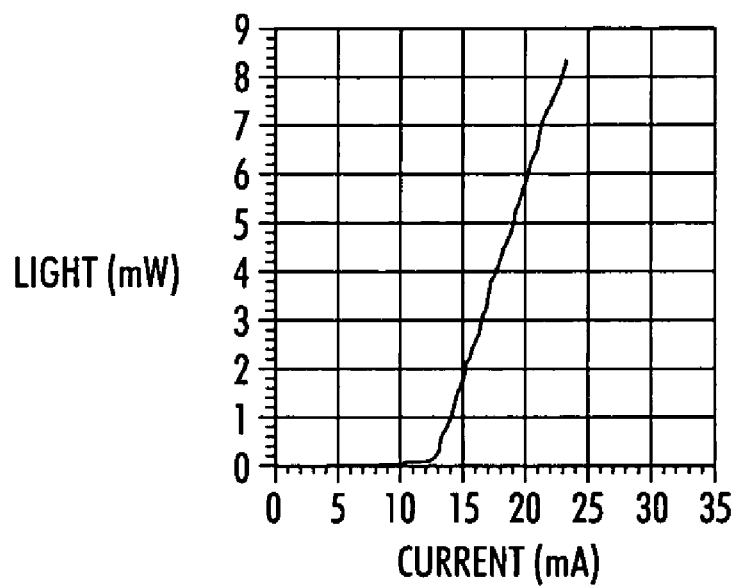
Figure 8:
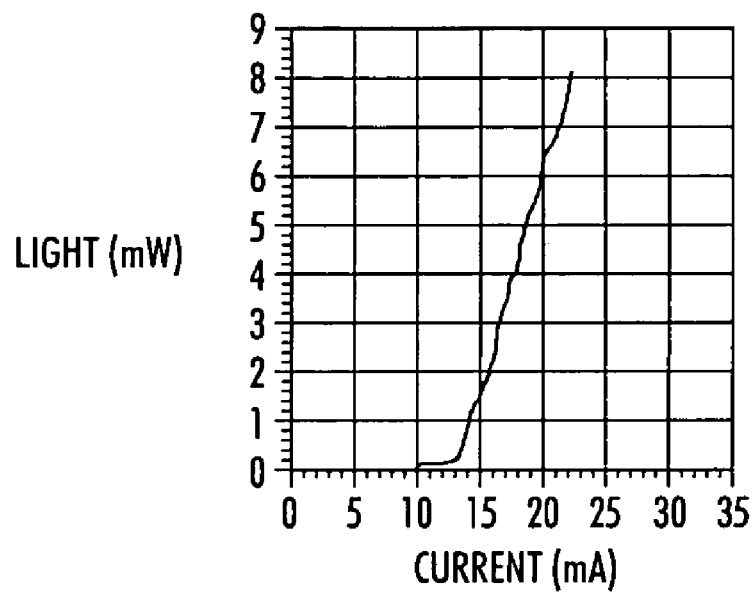
Figure 9:
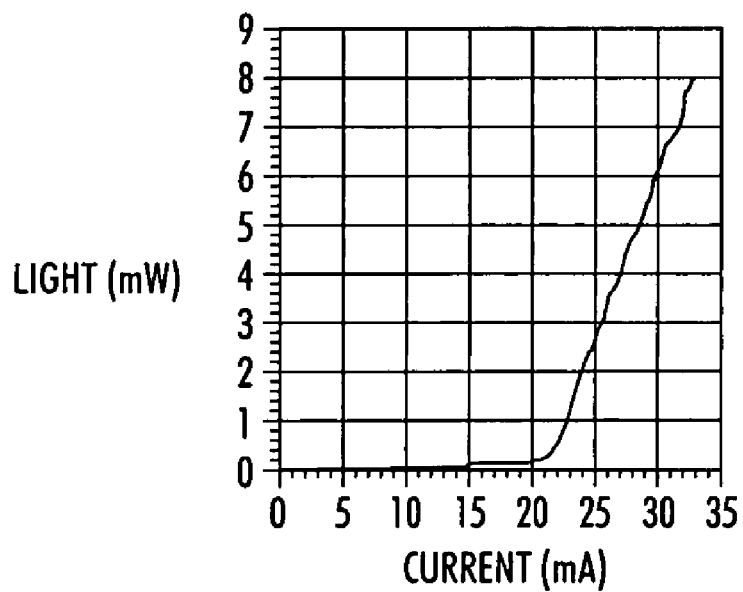

FIGS. 6–9 show the light versus current characteristics of the four light emitting elements of an exemplary phosphorous free quad-spot laser array that employs the trench isolation as discussed above. FIG. 6 illustrates the light current curve of a first light emitter. FIG. 7 illustrates a light current curve of a second light emitter. FIG. 8 illustrates a light current curve of a third light emitter, and FIG. 9 illustrates a light current curve of a fourth light. As shown in FIGS. 6–9, the threshold currents are between 14 to 21 mA, the differential quantum effects are between 40 to 60%. As shown, the L-I curves of a laser elements in a 7 μm-spaced quad-spot array in terms of droop at twice threshold is less than 6%, and the crosstalk between adjacent devices at twice threshold is less than 2.8%.

Figure 10:
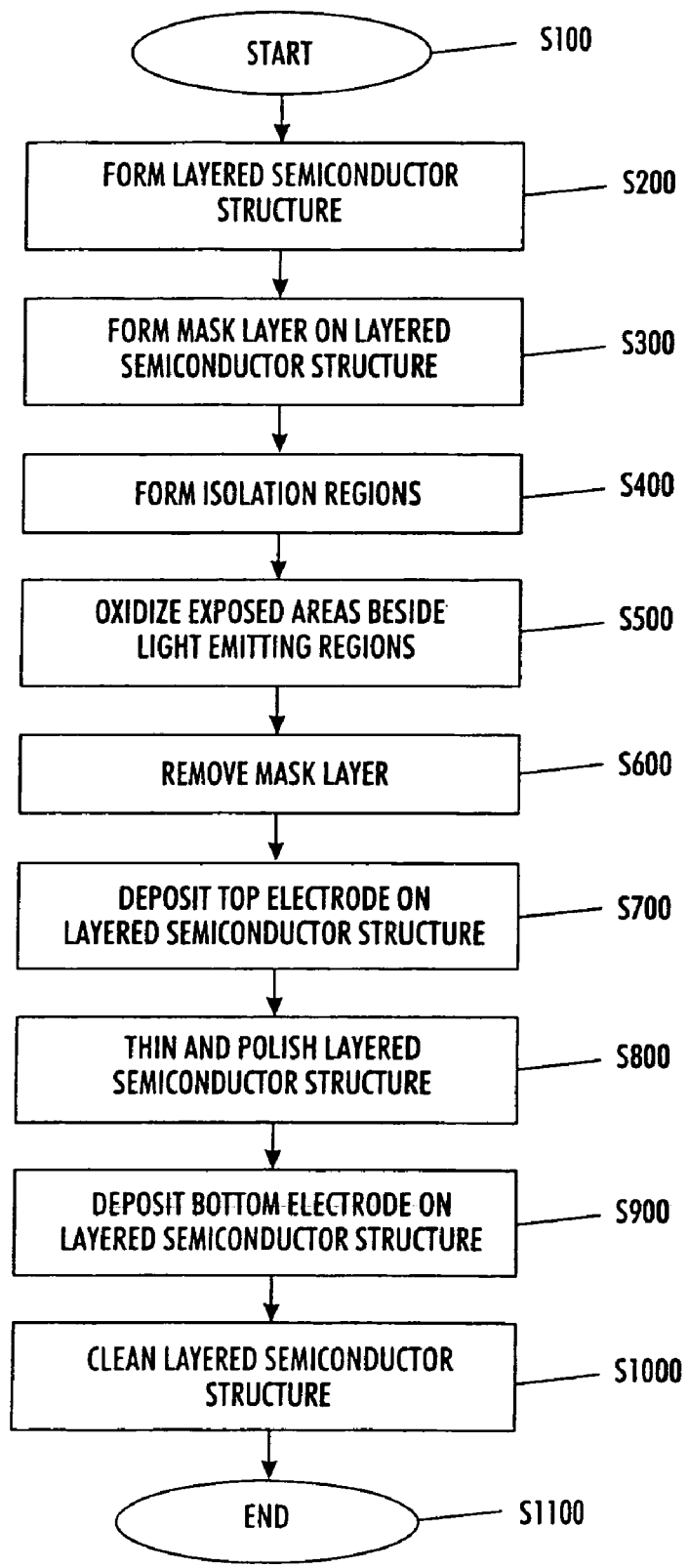
FIG. 10 is a flowchart outlining one exemplary embodiment of a method for forming a light emitter according to this invention.

FIG. 10 is a flowchart outlining one exemplary embodiment of a method for forming a light emitter according to this invention. As shown in FIG. 10, operation of the process starts in step S100 and continues to step S200, where various layers of a layered semiconductor structure are formed. Then, in step S300, a mask layer is formed on or over the last doped group III-V layer that was formed in step S200. Next, in step S400, the light emitting regions are defined by forming the isolation regions, such as, for example, by etching or ion implantation. Operation then continues to step S500.

In step S500, the exposed areas beside the light emitting regions are oxidized, such as, for example, in a wet oxidation furnace. Then, in step S600, the mask layer is removed. Next, in step S700, the electrodes are deposited on desired areas on or over the layered structure. Operation then continues to step S800.

In step S800, the layered structure is thinned and polished. Next, in step S900, electrodes are deposited on the backside of the layered structure. Then, in step S1000, the layered structure is cleaved to form individual laser emitter. Operation then continues to step S1100, where operation of the method ends.

It should be appreciated that, in step S200, the various layers of a layered semiconductor structure that are formed, include one or more of a group III-V semiconductor substrate; a complex group III-V semiconductor layer formed on or over the substrate; a waveguide layer formed on or over the complex semiconductor layer; a first cladding layer formed on or over the waveguide layer; a quantum well layer formed on or over the first cladding layer; a second cladding layer formed on or over the quantum well layer; a second waveguide layer formed on or over the second cladding layer; an intrinsic group III-V layer formed on or over the second waveguide layer; and/or a doped group III-V layer formed on or over the intrinsic group III-V layer. Additionally, portions of a patterned silicon nitride layer can be formed on or over the doped group III-V layer.

It should be appreciated that, in step S300, in various exemplary embodiments, the mask layer can be formed using silicon nitride. The silicon nitride layer functions as a mask for an oxidation step in subsequent processing. If desired, other suitable mask layers, such as silicon oxide or spin-on glass can be used instead of the silicon nitride layer.

It should be appreciated that, in step S400, in case of etching, in various exemplary embodiments, the layers formed in step S200 are etched down to near to the middle of the complex group III-V semiconductor layer formed on or over the substrate. Since the device features are small, the etching process can be performed using dry etching techniques. Chlorine gas-based chemically assisted ion beam etching is one such dry etching techniques.

It should be appreciated that, in step S500, in various exemplary embodiments, the oxidation may be done at 450° C. for about 90 minutes. The oxidation proceeds downward from the surface and stops near the first cladding layer formed on or over the complex semiconductor layer. At that point, the oxidation rate slows down considerably, due to the low aluminum content. The oxidized layers have a low refractive index of about 1.5, so the resulting structure produces an array of highly-index-guided light emitters. The oxidized, confined light emitters perform significantly better than more conventional light emitters.

It should be appreciated that, in step S700, in various exemplary embodiments, the top electrical electrode is typically formed using titanium (Ti) and gold (Au), but can be formed using any metal capable of establishing electrical contact with a p-type complex semiconductor. Additionally, any metal which reduces the contact energy between the p-type complex semiconductor and a metal may be used.

It should be appreciated that, in step S900, in various exemplary embodiments, an n-contact, typically germanium (Ge) and gold (Au), is deposited on the backside of the layered structure. In various exemplary embodiments, a high reflecting (HR) coating can be deposited on one or both facets of the light emitter, if desired.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, no limiting. Various changes may be made without departing from the spirit and scope of the invention.

What is claimed is:

1. An array of light emitters, comprising:
   a plurality of light emitting structures that include at least one quantum well layer, at least one cladding layer formed over the at least one quantum well layer, and at least one waveguide layer formed over the at least one cladding layer; and
   at least one oxidized isolation region formed at least in between at least two of the plurality of light emitting structures, the at least one isolation region defining a planar top surface on which an electrode can be deposited and isolating the at least two light emitting structures from each other by an oxidized region that extends into the light emitting structure through several of the layers to provide lateral electrical and optical confinement of adjacent light emitters.

2. The array of light emitters of claim 1, wherein the isolation region extends into the light emitting structure past the at least one quantum well layer to at least the waveguide layer.

3. The array of light emitter of claim 1, wherein the oxidized region is formed by ion implantation.

4. The array of light emitter of claim 2, wherein the at least one isolation region is a filled volume.

5. The light emitter of claim 2, wherein the quantum well layer, the cladding layer, and the waveguide layer are substantially free of phosphorous.

6. The light emitter of claim 5, wherein the at least one cladding layer and the at least one waveguide layer is a compound semiconductor consisting essentially of aluminum, gallium, and arsenic.

7. The light emitter of claim 5, wherein the at least one quantum well layer is a compound semiconductor consisting essentially of indium, aluminum, gallium, and arsenic.

8. The light emitter of claim 1, wherein the at least one quantum well layer emits a light with a wavelength of between 700 and 850 nm.

9. The light emitter of claim 8, wherein the at least one quantum well layer emits a light with a wavelength of between 775 and 785 nm.

10. A method of forming an array of light emitters, comprising:
    forming a plurality of light emitting structures, comprising:
    forming at least one quantum well layer,
    forming at least one cladding layer over the at least one quantum well layer,
    forming at least one waveguide layer over the at least one cladding layer; and
    forming at least one oxidized planar isolation region at least in between at least two of the plurality of light emitting structures, the at least one isolation region isolating the at least two light emitting structures by including an oxidized region that extends into the light emitting structure through several of the layers to provide lateral electrical and optical confinement of adjacent light emitting regions.

11. The method of claim 10, wherein forming the at least one isolation region further comprises forming the at least one isolation region such that the at least one isolation region extends past the at least one quantum well layer to at least the waveguide layer.

12. The method of claim 10, wherein forming the at least one isolation region comprises etching away a portion of the array of light emitters to form the isolation region.

13. The method of claim 12, wherein etching away the portion comprises dry etching the portion.

14. The method of claim 10, wherein forming the at least one isolation region comprises oxidizing the at least one region by ion implantation.

15. A method of forming a light emitter array, comprising:
    forming a group III-V semiconductor substrate;
    forming a complex group III-V semiconductor layer on or over the substrate;
    forming a waveguide layer on or over the complex semiconductor layer;
    forming a first cladding layer on or over the waveguide layer;
    forming a quantum well layer on or over the first cladding layer;
    forming a second cladding layer on or over the quantum well layer;
    forming a second waveguide layer on or over the second cladding layer;
    forming an intrinsic group III-V layer on or over the second waveguide layer;
    forming a doped group III-V layer on or over the intrinsic group III-V layer;
    forming a mask layer formed on or over a doped group III-V layer formed on or over the intrinsic group III-V layer;
    defining at least two light emitting regions;
    forming isolation regions between at least one pair of the at least two light emitting regions;
    oxidizing the exposed areas beside the light emitting regions;
    removing the mask;
    depositing at least one top electrode on the light emitter array;
    thinning and polishing the light emitter array;
    depositing at least one back-side electrode on the light emitter array; and
    cleaving the light emitter array to form individual laser emitters,
    wherein the oxidizing defines a planar top surface on which the at least one top electrode can be deposited and defines an oxidized region that extends into the light emitting structure through several of the layers to provide lateral electrical and optical confinement of the adjacent light emitting regions.

16. The method of claim 15, wherein forming isolation regions comprises forming the isolation regions by implanting ions into portions of the light emitter array.

17. The method of claim 15, wherein oxidizing the exposed areas comprises oxidizing the exposed areas in a wet oxidation furnace.

18. The array of light emitters of claim 1, wherein the plurality of light emitting structures are densely arranged with a pitch of about 7 μm with a droop of less than 6% and crosstalk between adjacent light emitting structures of less than 2.8%.

19. The array of light emitters of claim 1, wherein the oxidized isolation regions have a lowered index of refraction to provide an array of highly-index-guided light emitters.

20. The method of claim 15, wherein the step of oxidizing lowers the index of refraction of the oxidized region to provide a highly-index-guided light emitter array.

21. The array of light emitters of claim 1, wherein the at least one isolation region has no material removed during formation to maintain mechanical integrity of the array.

22. The method of claim 15, wherein the step of forming isolation regions does not remove material from the layered structure to maintain mechanical integrity of the array of light emitters.

* * * * *

UNITED STATES PATENT AND TRADEMARK OFFICE
CERTIFICATE OF CORRECTION

PATENT NO. : 7,120,182 B2 Page 1 of 1
APPLICATION NO. : 10/739181
DATED : October 10, 2006
INVENTOR(S) : Christopher L. Chua and Decai Sun It is certified that error appears in the above-identified patent and that said Letters Patent is hereby corrected as shown below:

Please delete the following:

(73) Assignee: Palo Alto Research Center, Inc., Palo Alto, CA (US)

Title page
    And Replace with the Following:

Item
    (73) Assignee: Palo Alto Research Center Incorporated, Palo Alto, CA (US)

Signed and Sealed this

Fourteenth Day of October, 2008

JON W. DUDAS
*Director of the United States Patent and Trademark Office*